United States Patent
Li

(10) Patent No.: US 11,024,686 B2
(45) Date of Patent: Jun. 1, 2021

(54) OLED PIXEL STRUCTURE AND OLED DISPLAY PANEL

(71) Applicant: Wuhan China Star Optoelectronics Semiconductor Display Technology Co., Ltd., Wuhan (CN)

(72) Inventor: Xiuyan Li, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 333 days.

(21) Appl. No.: 16/312,284

(22) PCT Filed: Sep. 18, 2018

(86) PCT No.: PCT/CN2018/106335
§ 371 (c)(1),
(2) Date: Dec. 21, 2018

(87) PCT Pub. No.: WO2019/205468
PCT Pub. Date: Oct. 31, 2019

(65) Prior Publication Data
US 2021/0083022 A1 Mar. 18, 2021

(30) Foreign Application Priority Data
Apr. 26, 2018 (CN) .......................... 201810388459.1

(51) Int. Cl.
*H01L 27/32* (2006.01)
*H01L 51/52* (2006.01)

(52) U.S. Cl.
CPC ...... *H01L 27/3246* (2013.01); *H01L 51/5209* (2013.01); *H01L 51/5225* (2013.01)

(58) Field of Classification Search
CPC ............ H01L 27/3246; H01L 51/5209; H01L 51/5225
(Continued)

(56) References Cited

U.S. PATENT DOCUMENTS

| 9,224,980 | B2 | 12/2015 | Yamazaki et al. |
| 9,263,506 | B2 * | 2/2016 | Kim ..................... H01L 27/3258 |

(Continued)

FOREIGN PATENT DOCUMENTS

| CN | 103943787 A | 7/2014 |
| CN | 104362257 A | 2/2015 |

(Continued)

*Primary Examiner* — Tu-Tu V Ho
(74) *Attorney, Agent, or Firm* — Leong C. Lei

(57) ABSTRACT

The invention provides an OLED pixel structure and OLED display panel. The OLED pixel structure comprises: a pixel definition layer, layer, a first pixel electrode, an OLED light-emitting layer, and a second pixel electrode; bottom of opening area of the pixel definition layer having a three-dimensional concave curved shape, the first pixel electrode disposed at the bottom of the corresponding opening area having a corresponding shape, the OLED light-emitting layer disposed on the first pixel electrode having a corresponding shape, the second pixel electrode disposed on the pixel definition layer and a portion corresponding to the OLED light-emitting layer having a corresponding shape. The invention provides a corresponding OLED display panel. The invention reduces the difference in path length of emitted light observed at different angles when passing through the OLED light-emitting layer and transparent electrode layer, thereby reducing the brightness and color observed by human eye at different angles.

8 Claims, 3 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2014/0312319 A1* | 10/2014 | Kim | H01L 27/3258 257/40 |
| 2018/0006259 A1 | 1/2018 | Paek et al. | |
| 2019/0027075 A1* | 1/2019 | Hughes | G09G 3/006 |
| 2019/0312098 A1* | 10/2019 | Matsueda | G09G 3/3291 |

FOREIGN PATENT DOCUMENTS

| | | |
|---|---|---|
| CN | 106941113 A | 7/2017 |
| CN | 107799662 A | 3/2018 |
| CN | 108538896 A | 9/2018 |

* cited by examiner

OLED PIXEL STRUCTURE AND OLED DISPLAY PANEL

BACKGROUND OF THE INVENTION

1. Field of the Invention

The present invention relates to the field of display, and in particular to an organic light-emitting diode (OLED) pixel structure and OLED display panel.

2. The Related Arts

The organic light-emitting diode (OLED) display device provides the advantages of self-luminous, low driving voltage, high luminous efficiency, short response time, high definition and contrast, near 180° viewing angle, wide temperature range, and ability to realize flexible display and larges-size full-color display, and so on, and are recognized by the industry as the most promising display device.

The OLED display devices can be classified into two types: passive matrix OLED (PMOLED) and active matrix OLED (AMOLED), wherein the AMOLED has pixels arranged in an array, is an active display type with high luminous efficiency, and is usually used as a high-definition large-size display device.

The OLED device generally comprises a substrate, an anode disposed on the substrate, a hole injection layer disposed on the anode, a hole transport layer disposed on the hole injection layer, a light-emitting layer disposed on the hole transport layer, an electron transport layer disposed on the light-emitting layer, an electron injection layer disposed on the electron transport layer, and a cathode disposed on the electron injection layer. The light emission principle of OLED devices is that semiconductor materials and organic materials and light-emitting materials are driven by electric fields, causing carrier injection and recombination to emit light. Specifically, an OLED device generally uses an indium tin oxide (ITO) pixel electrode and a metal electrode as anodes and cathodes of the device, respectively. Under a certain voltage, electrons and holes are injected from the cathode and the anode into the electron injection layer and the hole injection layer, respectively. The electrons and holes migrate to the light-emitting layer through the electron transport layer and the hole transport layer, respectively, and meet in the light-emitting layer to form excitons and excite the light-emitting molecules, and the latter emits visible light through radiation relaxation.

At present, the OLED display panel has different visual perceptions of colors at different viewing angles, mainly because of the color shift of RGB (red, green, and blue) at different viewing angles of the planar pixel design, so that the color images composed of RGB also have visual differences, and there is a correlation between the occurrence of the color shift and the difference among the path length (optical path) observed at different angles of emitted light passing the OLED light-emitting layer and the transparent electrode layer.

Refer to FIG. 1, which is a schematic view showing a conventional OLED pixel structure. The OLED pixel structure mainly comprises a substrate (not shown), a pixel definition layer 10 disposed on the substrate, an anode 11 disposed at bottom of an open area of the pixel definition layer 10, a light-emitting layer 12 disposed inside the opening area of the pixel definition layer 10, and a cathode 13 disposed on the pixel definition layer 10. The opening area of the pixel definition layer 10 is a via disposed spaced apart on the pixel definition layer, and the opening area is used to form a pixel area correspondingly, such as, red (R), green (G), or blue (B). The OLED light-emitting layer 12 is disposed in the opening area so that light-emitting layer 12 can be driven by the anode 11 at the bottom of the opening area and the cathode 13 disposed on the pixel definition layer 10 to emit light. The anode 11 is a reflective electrode and the cathode 13 is a transparent electrode layer. The OLED light-emitting layer 12 that emits light under voltage driving can be generally composed of a hole injection layer, a hole transport layer, a light-emitting layer, an electron transport layer, and an electron injection layer, stacked together. In the conventional OLED pixel structure, the anode 11, the OLED light-emitting layer 12 and the cathode 13 are all planar designs. In vertical viewing angle, the path length (optical path) of the OLED light-emitting layer 12 and the cathode 13 through which the light exits is L. When the viewing angle is θ, the path length (optical path) of the OLED light-emitting layer 12 and the cathode 13 through which the emitted light passes becomes L/cos θ, because the generation of the color shift is related to the path length (optical path) of the emitted light from the OLED light-emitting layer 12 observed at different viewing angles, the brightness and color are different in visual perception at different angles.

SUMMARY OF THE INVENTION

The object of the present invention is to provide an OLED pixel structure, to reduce the difference in brightness and color observed by human eyes at different angles.

Another object of the present invention is to provide an OLED display panel, to reduce the difference in brightness and color observed by human eyes at different angles.

To achieve the above object, the present invention provides an OLED pixel structure, which comprises: a pixel definition layer, layer, a first pixel electrode, an OLED light-emitting layer, and a second pixel electrode; bottom of an opening area of the pixel definition layer having a three-dimensional concave curved shape, the first pixel electrode being disposed at the bottom of the corresponding opening area and having a corresponding three-dimensional concave curved shape, the OLED light-emitting layer being disposed on the first pixel electrode in the corresponding opening area and having a corresponding three-dimensional concave curved shape, the second pixel electrode being disposed on the pixel definition layer and a portion of the second pixel electrode corresponding to the OLED light-emitting layer having a corresponding three-dimensional concave curved shape.

Wherein, the pixel definition layer is formed prior to the first pixel electrode so that the three-dimensional concave curved shape of the bottom of the opening area of the pixel definition layer can define a shape of the first pixel electrode.

Wherein, the first pixel electrode is an anode, and the second pixel electrode is a cathode.

Wherein, the first pixel electrode is a cathode, and the second pixel electrode is an anode.

Wherein, a spacer is disposed between the second pixel electrode and the pixel definition layer outside the opening area.

Wherein, an encapsulation layer is disposed on the second pixel electrode.

The present invention also provides an OLED display panel, which comprises: a thinfilm transistor (TFT) array substrate and an OLED pixel structure disposed on the TFT array substrate; the OLED pixel structure, further comprising: a pixel definition layer, layer, a first pixel electrode, an OLED light-emitting layer, and a second pixel electrode; bottom of an opening area of the pixel definition layer having a three-dimensional concave curved shape, the first pixel electrode being disposed at the bottom of the corresponding opening area and having a corresponding three-dimensional concave curved shape, the OLED light-emitting layer being disposed on the first pixel electrode in the corresponding opening area and having a corresponding three-dimensional concave curved shape, the second pixel electrode being disposed on the pixel definition layer and a portion of the second pixel electrode corresponding to the OLED light-emitting layer having a corresponding three-dimensional concave curved shape.

Wherein, the pixel definition layer of the OLED pixel structure is disposed on a planarization layer of the TFT array substrate, and a plurality of vias are disposed between the planarization layer and the pixel definition layer to enable the first pixel electrode to respectively contact a TFT electrode inside the TFT array substrate.

Wherein, the pixel definition layer is formed prior to the first pixel electrode so that the three-dimensional concave curved shape of the bottom of the opening area of the pixel definition layer can define a shape of the first pixel electrode.

Wherein, the TFT array substrate is a low temperature polysilicon (LTPS) substrate or an indium gallium zinc oxide (IGZO) array substrate.

In summary, the OLED pixel structure and the OLED display panel of the present invention can reduce the difference in path length of the emitted light observed at different angles when passing through the OLED light-emitting layer and the transparent electrode layer, thereby reducing the brightness and color observed by the human eye at different angles.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
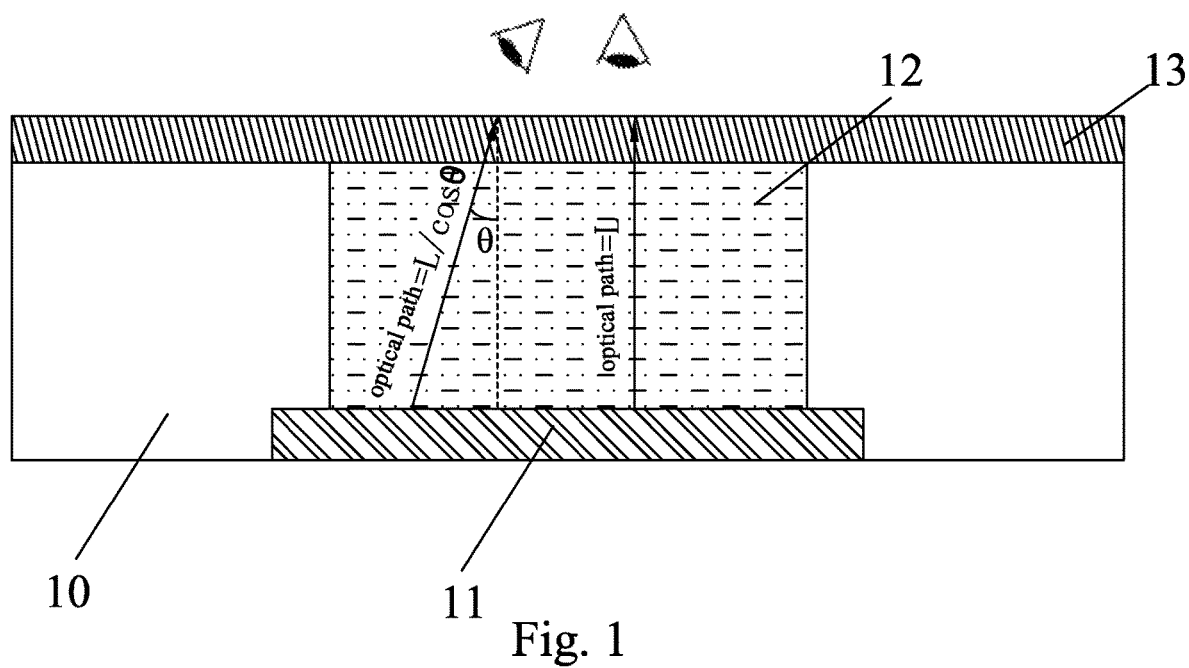
FIG. 1 is a schematic view showing a conventional OLED pixel structure.
Figure 2:
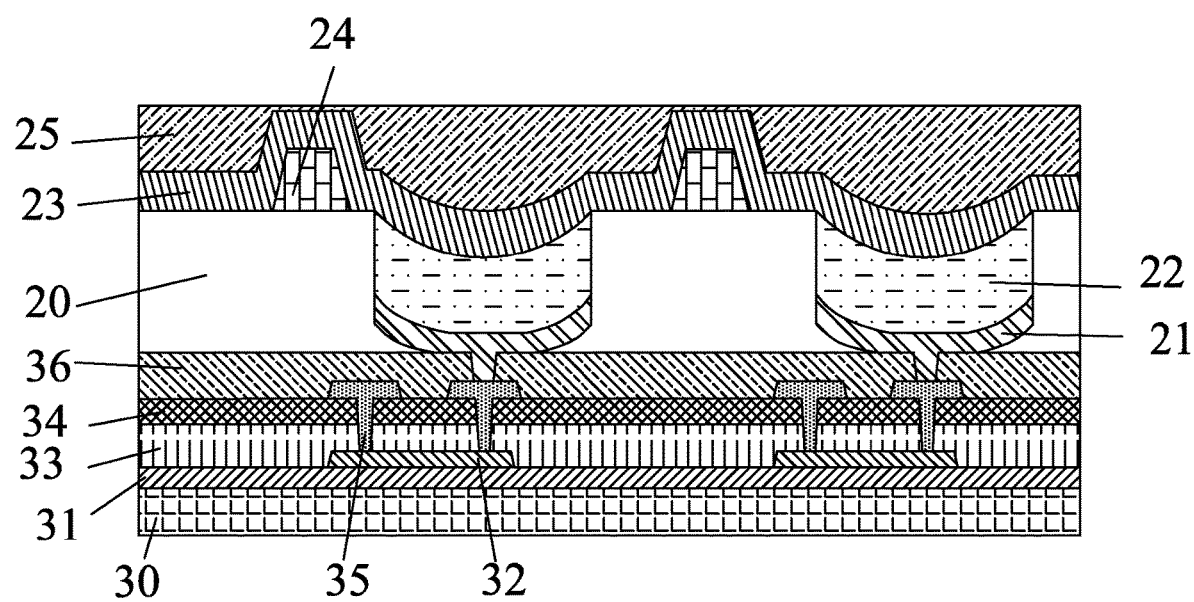
FIG. 2 is a schematic view showing a preferred embodiment of the OLED display panel of the present invention.

Refer to FIG. 2, which is a schematic view showing a preferred embodiment of the OLED display panel of the present invention. The OLED display panel comprises the OLED pixel structure of the present invention. The OLED display panel comprises a thin film transistor (TFT) array substrate and an OLED pixel structure disposed on the TFT array substrate. The OLED pixel structure further comprises: a pixel definition layer 20, layer, a plurality of first pixel electrodes 21, a plurality of OLED light-emitting layers 22, and a second pixel electrode 23. The first pixel electrode 21 is a reflective electrode and the second pixel electrode 23 is a transparent electrode. In a preferred embodiment, the first pixel electrode 21 is an anode, and the second pixel electrode 23 is a cathode. In other embodiments, the first pixel electrode 21 may be a cathode, and the second pixel electrode 23 may be an anode. The pixel definition layer 20 comprises a plurality of opening areas, spaced apart. The opening areas are vias disposed spaced apart on the pixel definition layer 20. The opening areas 21 are used to form pixel areas correspondingly, such as, red (R), green (G), or blue (B). The first pixel electrodes 21 are disposed respectively at the bottom of the opening areas. The OLED light-emitting layers 22 are disposed respectively on the first pixel electrodes 21 in the opening areas. The second pixel electrode 23 is disposed on the pixel definition layer 20 to cover the opening areas and non-opening areas so that the first pixel electrodes 21 and the second pixel electrode 23 can drive the OLED light-emitting layers 23 to emit light.

In the present invention, the bottom of the opening area of the pixel definition layer 20 has a three-dimensional concave curved shape, the first pixel electrode 21 is disposed at the bottom of the corresponding opening area and has a corresponding three-dimensional concave curved shape at lower surface, the OLED light-emitting layer 22 is disposed on the first pixel electrode in the corresponding opening area and has a corresponding three-dimensional concave curved shape at lower surface, the second pixel electrode 23 is disposed on the pixel definition layer 20 and a portion of the second pixel electrode 23 corresponding to the OLED light-emitting layer 22 has a corresponding three-dimensional concave curved shape at upper and lower surfaces. Contrast to the conventional process wherein the first pixel electrode 21 is manufactured before the pixel definition layer 20, in the present invention, the pixel definition layer 20 is formed prior to the first pixel electrode 21 so that the three-dimensional concave curved shape of the bottom of the opening area of the pixel definition layer 20 can define a shape of the first pixel electrode. Then, the OLED light-emitting layer 22 and the second pixel electrode 23 are sequentially formed. The pixel definition layer 20 is formed by using a halftone mask (HTM) or a gray tone mask (GTM) or other exposure mode. After the curved shape of the pixel definition layer 20 is formed, the subsequent layers naturally form a curved shape along the pixel definition layer 20. The present invention obtains a pixel having a concave three-dimensional concave curved shape, and the OLED light-emitting layer 22 has a corresponding three-dimensional concave curved shape. Compared with the prior art, the present invention enables the emitted light observed at different angles to pass the substantially same path length through the OLED light-emitting layer 22 and the second pixel electrode 23 (transparent electrode layer), thereby reducing the difference in brightness and color observed by the human eye at different angles. That is, the total thickness of the OLED light-emitting layer 22 and the second pixel electrode 23 (transparent electrode layer) at different angles is substantially the same.

When manufacturing the OLED pixel structure of the present invention, the pixel definition layer 20 may be formed on an insulating layer of the outermost layer of the corresponding TFT array substrate (the planarization layer 36 in the preferred embodiment), and then patterned to form a plurality of vias on the pixel definition layer 20, i.e., the opening areas, which respectively define corresponding pixel areas, and the bottom of the opening area of the pixel definition layer 20 is formed as a three-dimensional concave curved shape; then the first pixel electrode 21 and the OLED light-emitting layer 22 are respectively fabricated in the opening area.

The OLED light-emitting layer 22 can generally comprises a hole injection layer, a hole transport layer, a light-emitting layer, an electron transport layer, an electron injection layer, and so on, and according to corresponding pixel areas such as red (R), green (G), or blue (B), each of the OLED light-emitting layers 22 can control the light emission, respectively. A plurality of spacers (PS) 24 may be disposed between the second pixel electrode 23 and the pixel definition layer 20 outside the opening area. An encapsulation layer 25, such as, a thin film encapsulation (TPE) layer, may also be disposed on the second pixel electrode 23.

The OLED display panel of the present invention is formed by disposing the OLED pixel structure of the present invention on a TFT array substrate, and the TFT array substrate may be a low temperature polysilicon (LPTS) array substrate or an indium gallium zinc oxide (IGZO) array substrate, or other types of array substrates with TFT array. In the preferred embodiment, a LTPS array substrate is used for explanation. The TFT array substrate mainly comprises a buffer layer 31, a semiconductor layer 32, a gate insulating layer 33, a gate layer (not shown), an interlayer insulating layer 34, a source/drain electrode layer 35, and a planarization layer 36, sequentially formed on the substrate 30.

The pixel definition layer 20 of the OLED pixel structure of the present invention is disposed on the planarization layer 36 of the TFT array substrate, and a plurality of vias are formed between the planarization layer 36 and the pixel definition layer 20 to make the first pixel electrodes 21 can respectively contact the TFT electrodes in the TFT array substrate, that is, the source/drain electrode layer 35, so that the OLED pixel structure can be separately driven by the TFT device in the TFT array substrate to realize the display function.

Figure 3:
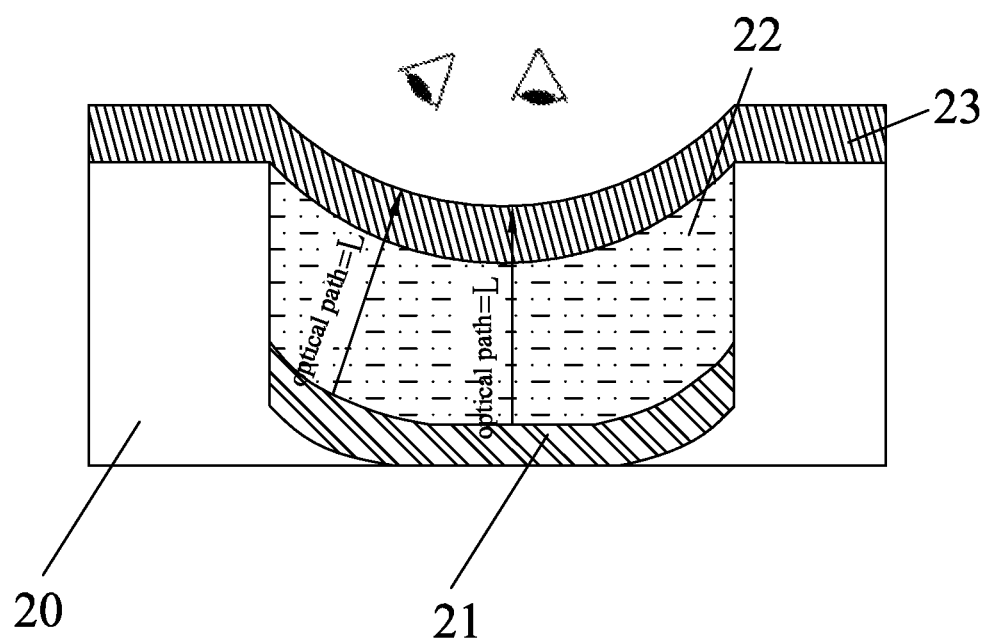
FIG. 3 is a schematic view showing a preferred embodiment of the OLED pixel structure of the present invention.

Refer to FIG. 3, which is a schematic view showing a preferred embodiment of the OLED pixel structure of the present invention. The bottom of the opening area of the pixel definition layer 20 is formed into a base design with a certain curvature, and the first pixel electrode 21 is formed on the bottom of the opening area of the pixel definition layer 20 to form a first pixel with a certain curvature. The OLED light-emitting layer 22 is formed on the first pixel electrode 21 to form an OLED light-emitting layer 22 with a certain curvature, and the second pixel electrode 23 is formed on the OLED light-emitting layer 22 with a certain curvature. As such, a pixel having a three-dimensional concave 3D concave curved shape is obtained Compared with the prior art, the present invention makes the path lengths of emitted light observed at different angles have the substantially same path length of the OLED light-emitting layer 22 and the second pixel electrode 23 (transparent electrode layer), which is the path L, thereby reducing occurrence of color shift.

In summary, the OLED pixel structure and the OLED display panel of the present invention can make the path length of the emitted light observed at different angles when passing through the OLED light-emitting layer and the transparent electrode layer substantially the same, thereby reducing occurrence of color shift.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An organic light-emitting diode (OLED) pixel structure, comprising: a pixel definition layer, a first pixel electrode, an OLED light-emitting layer, and a second pixel electrode; bottom of an opening area of the pixel definition layer having a three-dimensional concave curved shape, the first pixel electrode being disposed at the bottom of the corresponding opening area and having a corresponding three-dimensional concave curved shape, the OLED light-emitting layer being disposed on the first pixel electrode in the corresponding opening area and having a corresponding three-dimensional concave curved shape, the second pixel electrode being disposed on the pixel definition layer and a portion of the second pixel electrode corresponding to the OLED light-emitting layer having a corresponding three-dimensional concave curved shape; wherein the pixel definition layer is formed prior to the first pixel electrode so that the three-dimensional concave curved shape of the bottom of the opening area of the pixel definition layer can define a shape of the first pixel electrode.

2. The OLED pixel structure as claimed in claim 1, wherein the first pixel electrode is an anode, and the second pixel electrode is a cathode.

3. The OLED pixel structure as claimed in claim 1, wherein the first pixel electrode is a cathode, and the second pixel electrode is an anode.

4. The OLED pixel structure as claimed in claim 1, wherein a spacer is disposed between the second pixel electrode and the pixel definition layer outside the opening area.

5. The OLED pixel structure as claimed in claim 1, wherein an encapsulation layer is disposed on the second pixel electrode.

6. An organic light-emitting diode (OLED) display panel, comprising: a thin film transistor (TFT) array substrate and an OLED pixel structure disposed on the TFT array substrate; the OLED pixel structure, further comprising: a pixel definition layer, a first pixel electrode, an OLED light-emitting layer, and a second pixel electrode; bottom of an opening area of the pixel definition layer having a three-dimensional concave curved shape, the first pixel electrode being disposed at the bottom of the corresponding opening area and having a corresponding three-dimensional concave curved shape, the OLED light-emitting layer being disposed on the first pixel electrode in the corresponding opening area and having a corresponding three-dimensional concave curved shape, the second pixel electrode being disposed on the pixel definition layer and a portion of the second pixel electrode corresponding to the OLED light-emitting layer having a corresponding three-dimensional concave curved shape; wherein the pixel definition layer is formed prior to the first pixel electrode so that the three-dimensional concave curved shape of the bottom of the opening area of the pixel definition layer can define a shape of the first pixel electrode.

7. The OLED display panel as claimed in claim 6, wherein the pixel definition layer of the OLED pixel structure is disposed on a planarization layer of the TFT array substrate, and a plurality of vias are disposed between the planarization layer and the pixel definition layer to enable the first pixel electrode to respectively contact a TFT electrode inside the TFT array substrate.

8. The OLED display panel as claimed in claim 6, wherein the TFT array substrate is a low temperature polysilicon (LTPS) substrate or an indium gallium zinc oxide (IGZO) array substrate.

* * * * *